(12) United States Patent
Tomioka

(10) Patent No.: US 10,444,777 B2
(45) Date of Patent: Oct. 15, 2019

(54) REVERSE-CURRENT-PREVENTION CIRCUIT AND POWER SUPPLY CIRCUIT

(71) Applicant: ABLIC Inc., Chiba-shi, Chiba (JP)

(72) Inventor: Tsutomu Tomioka, Chiba (JP)

(73) Assignee: Ablic Inc., Chiba (JP)

(*) Notice: Subject to any disclaimer, the term of this patent is extended or adjusted under 35 U.S.C. 154(b) by 0 days.

(21) Appl. No.: 16/221,770

(22) Filed: Dec. 17, 2018

(65) Prior Publication Data

US 2019/0220048 A1 Jul. 18, 2019

(30) Foreign Application Priority Data

Jan. 15, 2018 (JP) ................................. 2018-004178

(51) Int. Cl.
| | |
|---|---|
| G05F 1/56 | (2006.01) |
| G05F 1/571 | (2006.01) |
| G05F 1/573 | (2006.01) |
| G05F 1/59 | (2006.01) |
| G05F 1/61 | (2006.01) |
| H03K 17/687 | (2006.01) |
| G01R 19/165 | (2006.01) |
| H02H 7/12 | (2006.01) |

(52) U.S. Cl.
CPC ....... *G05F 1/571* (2013.01); *G01R 19/16528* (2013.01); *H03K 17/6871* (2013.01); *H02H 7/1213* (2013.01)

(58) Field of Classification Search
CPC ... G05F 1/10; G05F 1/56; G05F 1/571; G05F 1/573; G05F 1/59; G05F 1/61
USPC ................. 361/56, 77, 82, 84; 327/538–543
See application file for complete search history.

(56) References Cited

U.S. PATENT DOCUMENTS

| | | | | |
|---|---|---|---|---|
| 4,654,578 A | * | 3/1987 | Salerno | G05F 3/245 323/313 |
| 6,005,378 A | * | 12/1999 | D'Angelo | G05F 3/242 323/273 |
| 6,552,603 B2 | * | 4/2003 | Ueda | G05F 3/24 323/313 |
| 6,653,891 B1 | * | 11/2003 | Hazucha | G05F 1/56 327/540 |

(Continued)

FOREIGN PATENT DOCUMENTS

JP 10-341141 A 12/1998

*Primary Examiner* — Gary L Laxton
*Assistant Examiner* — Sisay G Tiku
(74) *Attorney, Agent, or Firm* — Brinks Gilson & Lione

(57) ABSTRACT

A reverse-current-prevention circuit includes a reverse-current-prevention transistor of a P-channel MOS transistor inserted between an input terminal supplied with a power supply voltage and an output stage transistor of a P-channel MOS transistor providing an output voltage from an output terminal, and a reverse-current-prevention controller configured to turn the reverse-current-prevention transistor from on to off according to exceedance of the output voltage to the power supply voltage. The reverse-current-prevention controller includes a first transistor of a depletion type P-channel MOS transistor having a source and gate respectively connected to the output terminal and the input terminal, and a second transistor of a depletion type P-channel MOS transistor having a source and gate respectively connected to a drain of the first transistor and a gate of the reverse-current-prevention transistor, and a drain grounded.

14 Claims, 6 Drawing Sheets

(56) References Cited

U.S. PATENT DOCUMENTS

| | | | | |
|---|---|---|---|---|
| 6,876,251 B2* | 4/2005 | Watanabe | ............... | G05F 3/245 |
| | | | | 323/315 |
| 6,933,760 B2* | 8/2005 | Haider | ................... | G05F 1/465 |
| | | | | 323/313 |
| 7,479,821 B2* | 1/2009 | Imura | ..................... | G05F 3/24 |
| | | | | 257/E27.061 |
| 7,982,531 B2* | 7/2011 | Yoshida | ............. | H01L 27/0883 |
| | | | | 323/313 |
| 9,921,595 B2* | 3/2018 | Nakamoto | ................ | G05F 1/56 |
| 2006/0138546 A1* | 6/2006 | Negoro | ..................... | G05F 1/56 |
| | | | | 257/355 |
| 2008/0012543 A1* | 1/2008 | Negoro | ..................... | G05F 1/46 |
| | | | | 323/272 |
| 2011/0062921 A1* | 3/2011 | Sudou | ...................... | G05F 1/56 |
| | | | | 323/273 |
| 2012/0242316 A1* | 9/2012 | Sudo | ....................... | G05F 1/573 |
| | | | | 323/311 |
| 2013/0188287 A1* | 7/2013 | Imura | ..................... | H02H 3/18 |
| | | | | 361/56 |
| 2013/0221939 A1* | 8/2013 | Endo | ........................ | G05F 1/10 |
| | | | | 323/271 |
| 2014/0104964 A1* | 4/2014 | Peng | ...................... | G11C 5/147 |
| | | | | 365/189.09 |
| 2015/0137881 A1* | 5/2015 | Zhu | ................ | H03K 19/018507 |
| | | | | 327/543 |

\* cited by examiner

REVERSE-CURRENT-PREVENTION CIRCUIT AND POWER SUPPLY CIRCUIT

RELATED APPLICATIONS

This application claims priority under 35 U.S.C. § 119 to Japanese Patent Application No. 2018-004178 filed on Jan. 15, 2018, the entire content of which is hereby incorporated by reference.

BACKGROUND OF THE INVENTION

1. Field of the Invention

The present invention relates to a reverse-current-prevention circuit and a power supply circuit.

2. Description of the Related Art

A step-down voltage regulator is used in a condition in which an input voltage is higher than an output voltage. There is however a possibility that the output voltage becomes higher than the input voltage, and current flows reversely from an output terminal depending on a usage condition and a circuit configuration. Such current is called reverse current.

Accordingly, there has been known a configuration in which a MOS transistor in an output stage of the voltage regulator is brought into an off-sate in such a manner that no reverse current flows according to a detection that the output voltage becomes higher than the input voltage (refer to, for example, Japanese Patent Application Laid-Open No. 10-341141).

In a voltage regulator of related art shown in FIG. 6, when the output voltage Vout becomes higher than the sum of the power supply voltage VDD which is an input voltage and the forward voltage Vf of a parasitic diode between the drain and backgate of the output stage P-channel MOS transistor 102, that is, when the following inequality (1) holds:

$$Vout > VDD + Vf \quad (1),$$

reverse current flows into the voltage regulator through the parasitic diode, provided that the reverse-current-prevention transistor 106 which is a P-channel MOS transistor is on.

In order to turn off the reverse-current-prevention transistor 106 the output from an inverter circuit constructed from a P-channel MOS transistor 10 and an N-channel MOS transistor 11 is thus supplied to the gate of the reverse-current-prevention transistor 106 when the output voltage Vout increases to satisfy the following inequality (2):

$$Vout > VDD + Vth\ (inv) \quad (2)$$

wherein Vth (inv) is the threshold voltage of the inverter circuit constructed from the P-channel MOS transistor 10 and the N-channel MOS transistor 11.

With this configuration, even if the output voltage Vout becomes higher than the input voltage, which is the power supply voltage VDD, it is possible to prevent the reverse current to the inside of the voltage regulator.

SUMMARY OF THE INVENTION

In the above-described Japanese Patent Application Laid-Open No. 10-341141 the forward voltage Vf and the threshold voltage Vth (inv) are designed to have nearly equal voltages.

There is however a case where the threshold voltage Vth (inv) becomes higher than the forward voltage Vf due to variations in process and temperature characteristic. In this case, a condition expressed in the following inequality (3) is considered to occur:

$$VDD + Vf < Vout < VDD + Vth\ (inv) \quad (3)$$

That is, in this condition though the output voltage Vout exceeds the sum of the power supply voltage VDD and the forward voltage Vf, the output voltage Vout is still lower than the sum of the power supply voltage VDD and the threshold voltage Vth (inv).

In the above-described condition of inequality (3), though the output voltage Vout exceeds the sum of the power supply voltage VDD and the forward voltage Vf, it is not possible to prevent the inflow of the reverse current since the reverse-current-prevention transistor 106 is still in on state. Thus, the reverse current flows into the voltage regulator.

In order to cope with this condition, there is a need to add a step of controlling the threshold voltage Vth (inv) to be lower than the forward voltage Vf for the purpose of preventing the occurrence of the condition expressed by the inequality (3) due to the process and the temperature characteristic, thereby increasing the manufacturing cost of the voltage regulator.

The present invention provides a reverse-current-prevention circuit and a power supply circuit which suppresses influences due to a process and a temperature characteristic and prevents a reverse current without adding a step for performing control or management of a process in which a forward voltage (Vf) of a parasitic diode of an output stage transistor and a threshold voltage (Vth (inv)) of an inverter circuit detecting an output voltage are brought into a state that no reverse current flows.

According to one aspect of the present invention there is provided a reverse-current-prevention circuit including: a reverse-current-prevention transistor being a P-channel MOS transistor inserted in series between an input terminal supplied with a power supply voltage and an output stage transistor being a P-channel MOS transistor suppling a prescribed output voltage from an output terminal; and a reverse-current-prevention controller configured to bring the reverse-current-prevention transistor from an on state to an off state according to exceedance of the output voltage to the power supply voltage, and having: a first transistor being a depletion type P-channel MOS transistor and having a source connected to the output terminal and a gate connected to the input terminal, and a second transistor being a depletion type P-channel MOS transistor and having a source connected to a gate of the second transistor, a drain of the first transistor, and a gate of the reverse-current-prevention transistor, and a drain being grounded, wherein the reverse-current-prevention controller controls on and off of the reverse-current-prevention transistor according to a voltage of the drain of the first transistor.

According to the present invention, there can be provided a reverse-current-prevention circuit and a power supply circuit which suppresses influences due to a process and a temperature characteristic and prevents a reverse current without adding a step of performing addition or management of a process for bringing a forward voltage (Vf) of a parasitic diode of an output stage transistor and a threshold voltage (Vth (inv)) of an inverter circuit detecting an output voltage into a state that no reverse current flows.

DETAILED DESCRIPTION OF THE PREFERRED EMBODIMENTS

First Embodiment

Figure 1:
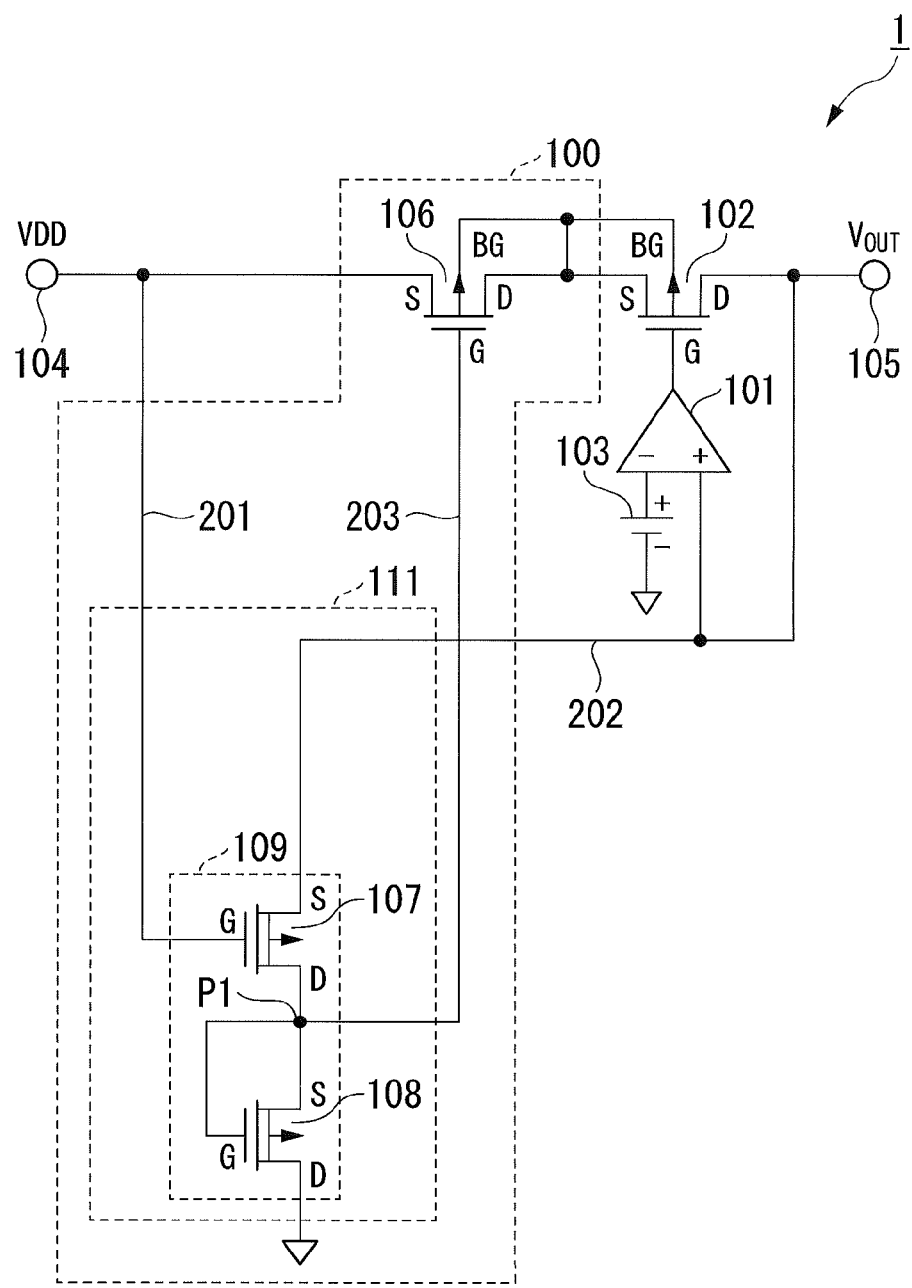
FIG. 1 is a schematic block diagram illustrating a voltage regulator for a power supply circuits, using a reverse-current-prevention circuit according to a first embodiment of the present invention.

The first embodiment of the present invention will hereinafter be described with reference to the accompanying drawing. FIG. 1 is a schematic block diagram illustrating a voltage regulator for a power supply circuit using a reverse-current-prevention circuit according to the first embodiment of the present invention.

In the schematic block diagram, the voltage regulator 1 includes a reverse-current-prevention circuit 100, a differential amplifier circuit 101, an output stage transistor 102, and a reference power supply 103. The reverse-current-prevention circuit 100 includes a reverse-current-prevention transistor 106 and a reverse-current-prevention controller 111. The reverse-current-prevention controller 111 includes a constant current inverter 109 having a first transistor 107 and a second transistor 108. Hereinafter transistors are enhancement type transistors unless defined as a depletion type in particular.

The reverse-current-prevention transistor 106 is a P-channel MOS transistor which has a source S connected to an input terminal 104, a gate G connected to a connecting point P1 through a wiring 203, and a drain D and a backgate BG respectively connected to a source S and a backgate BG of the output stage transistor 102.

The output stage transistor 102 is a P-channel MOS transistor which has a gate G connected to an output terminal of the differential amplifier circuit 101, and a drain D connected to an output terminal 105.

The differential amplifier circuit 101 has a plus side input terminal connected to the output terminal 105, and a minus side input terminal connected to a plus terminal of the reference power supply 103.

The reference power supply 103 has a minus terminal which is grounded, and a plus terminal which supplies a reference voltage for controlling an output voltage Vout.

The first transistor 107 is a depletion type P-channel MOS transistor which has a source S connected to the output terminal 105 through a wiring 202, a gate G connected to the input terminal 104 through a wiring 201, and a drain D connected to the connecting point P1.

The second transistor 108 is a depletion type P-channel MOS transistor which has a source S and a gate G connected to the connecting point P1, and a drain D which is grounded.

The first transistor 107 and the second transistor 108 respectively have the gate of the same aspect ratio and have the same source S-to-drain D voltage-current characteristic.

In the above configuration, the differential amplifier circuit 101 compares the reference voltage Vref supplied from the reference power supply 103 to its minus side terminal and the output voltage Vout supplied from the output terminal 105 to the plus side terminal. Then, in response to the result of the comparison, the differential amplifier circuit 101 controls a control voltage supplied from its output terminal to the gate G of the output stage transistor 102 in such a manner that the output voltage Vout becomes equal to the reference voltage Vref.

Thus, when the power consumption of the load connected to the output terminal 105 is changed, the differential amplifier circuit 101 controls the output voltage Vout supplied from the output stage transistor 102 to be always equal to the reference voltage Vref. As a result, the voltage regulator 1 operates as a constant voltage power supply circuit.

The operation of the reverse-current-prevention controller 111 of FIG. 1 will be described below.

As described above, since the gates G of the first transistor 107 and the second transistor 108 are the same in aspect ratio in the constant current inverter 109, a threshold voltage Vth (inv) as for the inverter becomes "0". That is, the source S and gate G of the second transistor 108 are short-circuited, and hence the voltage between the gate G and the source S becomes "0".

The drain current in the first transistor 107 and the drain current in the second transistor 108 become the same value when the difference between a power supply voltage VDD supplied to the gate G of the first transistor 107 and the output voltage Vout supplied to the source S thereof becomes zero, i.e., the power supply voltage VDD and the output voltage Vout are equal (i.e., VDD=Vout).

Further, the reverse-current-prevention controller 111 outputs, as a control signal, the voltage of the connecting point P1 which is an output terminal of the constant current inverter 109 to the gate G of the reverse-current-prevention transistor 106.

Thus, when the output voltage Vout is less than or equal to the power supply voltage VDD (i.e., VDD≥Vout), the voltage of the connecting point P1 of the constant current inverter 109 in the reverse-current-prevention controller 111 is maintained at zero and the reverse-current-prevention controller 111 maintains the reverse-current-prevention transistor 106 in on state since the drain current of the first transistor 107 becomes less than or equal to the drain current of the second transistor 108.

On the other hand, when the output voltage Vout exceeds the power supply voltage VDD (i.e., VDD<Vout), the voltage between the gate G and source S of the first transistor 107 does not become zero (VDD−Vout<0), and the drain current of the first transistor 107 becomes larger than the current value of the drain current of the second transistor 108. The voltage of the connecting point P1 of the constant current inverter 109 in the reverse-current-prevention controller 111 thus rises to control transition of the reverse-current-prevention transistor 106 from on state to off state.

In the present embodiment, as described above, the constant current inverter 109 can cancel the change in characteristics due to variation in process and ambient temperature changes because the first transistor 107 and the second transistor 108 have the same aspect ratio of the gate G and the same source S-to-drain D voltage-current characteristic.

Thus, according to the present embodiment, the configuration of the above-described constant current inverter 109 enables suppression of influences caused by a change in characteristics due to variation in process and temperature without adding a step of performing control or management of a process for bringing a forward voltage Vf of the parasitic diode of the output stage transistor 102 and the threshold voltage Vth (inv) into a condition that no reverse current flows. The timing at which the output voltage Vout becomes higher than the power supply voltage VDD can be detected accurately in real time. According to the present embodiment, when the output voltage Vout becomes higher than the power supply voltage VDD, the reverse-current-prevention controller 111 can bring the reverse-current-prevention transistor 106 into off state and prevent the reverse current from the output terminal 105 into the voltage regulator 1 through the parasitic diode of the output stage transistor 102.

Second Embodiment

Figure 2A:
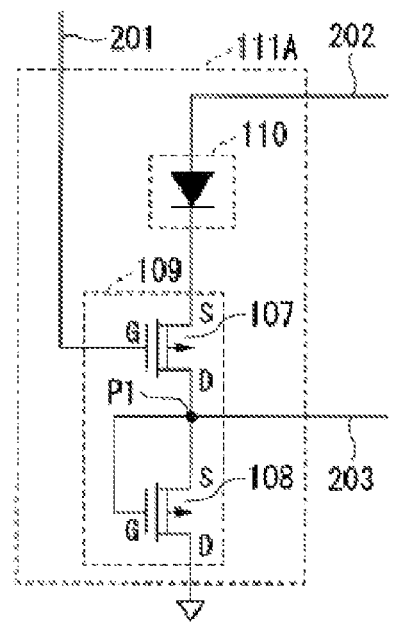
FIG. 2A is a schematic block diagram illustrating a configurational example of a reverse-current-prevention controller according to a second embodiment of the present invention.
Figure 2B:
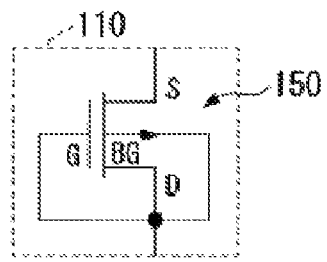
FIG. 2B is a schematic block diagram illustrating a configurational example of a PN junction element in the second embodiment of the present invention.

The second embodiment of the present invention will hereinafter be described with reference to the accompanying drawings. FIGS. 2A and 2B are schematic block diagrams illustrating a reverse-current-prevention controller according to the second embodiment of the present invention. FIG. 2A illustrates a configurational example of a reverse-current-prevention controller 111A according to the second embodiment.

In FIG. 2A, the reverse-current-prevention controller 111A of the second embodiment has a PN junction element (diode) 110 inserted in a forward direction between the output terminal 105 and the constant current inverter 109 of the reverse-current-prevention controller 111 which was shown in the first embodiment.

The PN junction element 110 has an anode connected to the output terminal 105 through the wiring 202, and a cathode connected to the source S of the first transistor 107.

Since the PN junction element 110 is inserted in series in the forward direction between the output terminal 105 and the constant current inverter 109, the voltage given to the source S of the first transistor 107 becomes Vout-Vf110 which is obtained by subtracting a forward voltage Vf110 of the PN junction element 110 from an output voltage Vout.

The output voltage Vout of the output terminal 105 needed for increasing the output from the constant current inverter 109 thus becomes VDD<Vout-Vf110, i.e., Vout>VDD+Vf110.

Further, in the output stage transistor 102, a parasitic diode exists between its drain D and backgate BG. Since the parasitic diode has a forward voltage Vf, reverse current flows into the output stage transistor 102 when the output voltage Vout of the output terminal 105 satisfies the inequality Vout>VDD+Vf.

Thus, provided that the relation Vf≥Vf110 holds between the forward voltage Vf of the parasitic diode and the forward voltage Vf110 of the PN junction element 110, when the output voltage Vout becomes greater than the sum of the forward voltage Vf of the parasitic diode of the output stage transistor and the power supply voltage VDD, the voltage of the connecting point P1 of the constant current inverter 109 rises to bring the reverse-current-prevention transistor 106 into off state.

In the second embodiment, since the PN junction element 110 is formed as a PN junction element, the PN junction element 110 has a similar configuration to the drain D-to-backgate BG parasitic diode of the output stage transistor 102 and is capable of canceling variations due to variation in process and a change in temperature. It is thus possible to always realize Vf=Vf110. According to the second embodiment, unlike the case of bringing the reverse-current-prevention transistor 106 into off state by the condition Vout>VDD in the first embodiment, the reverse-current-prevention transistor 106 can be brought into off state when the output voltage satisfies the condition Vout>VDD+Vf, and the reverse current actually flows into the output stage transistor 102.

That is, according to the second embodiment, the reverse-current-prevention transistor 106 can be brought into off state at such timing as the reverse current starts flowing into the output stage transistor 102 without bringing the reverse-current-prevention transistor 106 into off state by taking a prescribed margin as in the first embodiment, thereby making it possible to prevent the flow of reverse current from the output terminal 105 through the output stage transistor 102 into the voltage regulator 1. Here, the prescribed margin is the forward voltage Vf of the drain D-to-backgate BG parasitic diode of the output stage transistor 102.

FIG. 2B illustrates a configurational example in which the PN junction element 110 is formed of a P-channel MOS transistor 150.

The P-channel MOS transistor 150 has a source S connected to the output terminal 105 through the wiring 202, and a gate G, a drain D, and a backgate BG respectively connected to the source S of the first transistor 107.

As described above, as the configurational example illustrated in FIG. 2B, the PN junction element 110 is formed as a drain D-to-backgate BG parasitic diode of the P-channel MOS transistor 150 so as to have a structure similar to that of the parasitic diode of the output stage transistor 102. By constructing the PN junction element 110 as the same type of element as the parasitic diode of the output stage transistor 102 in this manner, the forward characteristic of the parasitic diode becomes similar to that of the parasitic diode of the output stage transistor 102 (Vf=Vf110), and hence the change in the forward voltage relative to variation in process and a change in temperature can be more suppressed.

Third Embodiment

Figure 3:
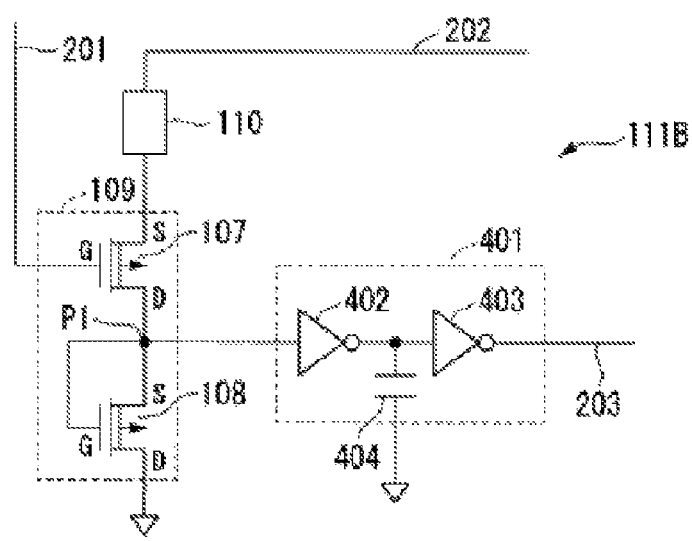
FIG. 3 is a schematic block diagram illustrating a reverse-current-prevention controller according to a third embodiment of the present invention.

The third embodiment of the present invention will hereinafter be described with reference to the accompanying drawings. FIG. 3 is a schematic block diagram illustrating a reverse-current-prevention controller 111B according to the third embodiment of the present invention. The third embodiment is different from the second embodiment in terms of a configuration in which in the reverse-current-prevention controller 111B, a waveform shaping circuit 401 is inserted between a connecting point P1 of a constant current inverter 109 and a gate G of a reverse-current-prevention transistor 106.

The waveform shaping circuit 401 is constructed to connect an inverter 402 and an inverter 403 in series. Further, a capacitive element (capacitor) 404 has one end connected between an output terminal of the inverter 402 and an input terminal of the inverter 403, and the other end grounded.

When the connecting point P1 is raised to a prescribed voltage, the waveform shaping circuit 401 outputs a signal of "H" level to the gate G of the reverse-current-prevention transistor 106 to bring the reverse-current-prevention transistor 106 into off state in accordance with the signal of "H" level.

Further, the capacitive element 404 is provided to delay a change in the output of the inverter 402 and supply the same to the inverter 403. The time taken for this delay is used for the timing adjustment of bringing the reverse-current-prevention transistor 106 into off state.

According to the third embodiment, since the waveform shaping circuit 401 outputs the "H" level signal of bringing the reverse-current-prevention transistor 106 into off state to the gate G of the reverse-current-prevention transistor 106 when the connecting point P1 becomes the prescribed voltage, the reverse-current-prevention transistor 106 can be brought into off state at high speed as compared with the second embodiment.

Also, according to the third embodiment, the time taken until the reverse-current-prevention transistor 106 is brought into off state after the output voltage Vout exceeds the sum of the power supply voltage VDD and the forward voltage Vf can be easily controlled by adjusting the capacitance of the capacitive element 404.

Further, the reverse-current-prevention controller 111 of the first embodiment may also be constructed to insert the above-described waveform shaping circuit 401 between the connecting point P1 of the constant current inverter 109 in FIG. 1 and the gate G of the reverse-current-prevention transistor 106.

Fourth Embodiment

Figure 4:
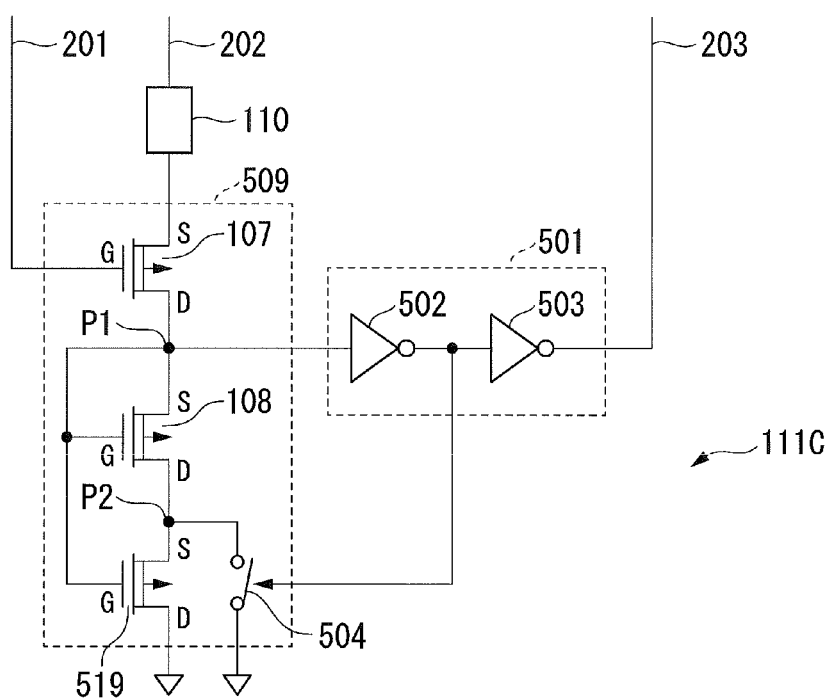
FIG. 4 is a schematic block diagram illustrating a reverse-current-prevention controller according to a fourth embodiment of the present invention.

The fourth embodiment of the present invention will hereinafter be described with reference to the accompanying drawings. FIG. 4 is a schematic block diagram illustrating a reverse-current-prevention controller 111C according to the fourth embodiment of the present invention. The fourth embodiment is different from the second embodiment in that the reverse-current-prevention controller 111C includes a constant current inverter circuit 509 and a waveform shaping circuit 501 instead of the constant current inverter 109.

The waveform shaping circuit 501 is constructed to connect an inverter 502 and an inverter 503 in series.

The constant current inverter circuit 509 includes a first transistor 107, a second transistor 108, a third transistor 519 which is a depletion type P-channel MOS transistor similar to each of the first transistor 107 and the second transistor 108, and a switch element 504.

In the constant current inverter circuit 509, the first transistor 107 has a gate G connected to an input terminal 104 through a wiring 201, a source S connected to an output terminal 105 through a PN junction element 110, and a drain D connected to a connecting point P1.

The second transistor 108 has a source S and a gate G connected to the connecting point P1 and a gate G of the third transistor 519, and a drain D connected to a source S of the third transistor 519 through a connecting point P2.

The third transistor 519 has a drain D which is grounded.

The switch element 504 has one end connected to the connecting point P2, the other end grounded, and a control terminal connected to an output terminal of the inverter 502. Here, when a signal of "H level is supplied to the control terminal, the switch element 504 becomes on state in which one end of the switch element 505 and the other end thereof are short-circuited. On the other hand, when a signal of an "L" level is supplied to the control terminal, the switch element 504 becomes off state in which one end of the switch element 505 and the other end thereof are released.

The above-described constant current inverter circuit 509 can have a hysteresis characteristic of the output voltage Vout against on/off control of a reverse-current-prevention transistor 106 according to on/off states of the switch element 504.

That is, since the connecting point P1 is at "L" level and the signal level supplied from the inverter 502 is at "H" level in a steady state where VDD+Vf110≥Vout holds, the switch element 504 is supplied with the signal of "H" level at its control terminal and thereby turned into on state. The drain D of the second transistor 108 is hence grounded, and a threshold voltage Vth509 of the constant current inverter circuit 509 is 0V in a manner similar to the threshold voltage Vth109 of the constant current inverter 109 in the first through third embodiments.

On the other hand, in an abnormal state in which reverse current flows and VDD+Vf110<Vout holds, since the voltage of the connecting point P1 increases and the signal level output from the inverter 502 becomes "L" level, the switch element 504 is supplied with the "L" level signal at its control terminal and thereby turned into off state.

When the switch element 504 transitions from on state to off state, the third transistor 519 is inserted between the drain D of the second transistor 108 and the ground as a resistor to reduce a current flowing through the second transistor 108. In the constant current inverter circuit 509 the threshold voltage changes to a threshold voltage Vth509B lower than the threshold voltage Vth509 thereof.

With the above-described configuration, according to the fourth embodiment, since the reverse-current-prevention transistor 106 is on/off-controlled, the threshold voltage of the constant current inverter circuit 509 detecting whether the output voltage Vout exceeds the power supply voltage VDD can be made low in the case where the reverse-current-prevention transistor 106 is in off state as compared with its on state. Thus, once the reverse-current-prevention transistor 106 is brought into off state, the output voltage Vout at the time when it is brought into off state can be given a hysteresis characteristic in which the reverse-current-prevention transistor 106 is not brought into on state unless the output voltage becomes a voltage low by a prescribed voltage. The reverse-current-prevention transistor 106 can be prevented from being operated in such an on/off operation as to cause oscillations in a short cycle. Thus, it is possible to suppress deterioration of the voltage regulator 1.

Further, the reverse-current-prevention controller 111 of the first embodiment may also be constructed to replace the constant current inverter 109 in FIG. 1 with the above-described constant current inverter 509 and insert the above-described waveform shaping circuit 501 between the connecting point P1 and the gate G of the reverse-current-prevention transistor 106.

Fifth Embodiment

Figure 5:
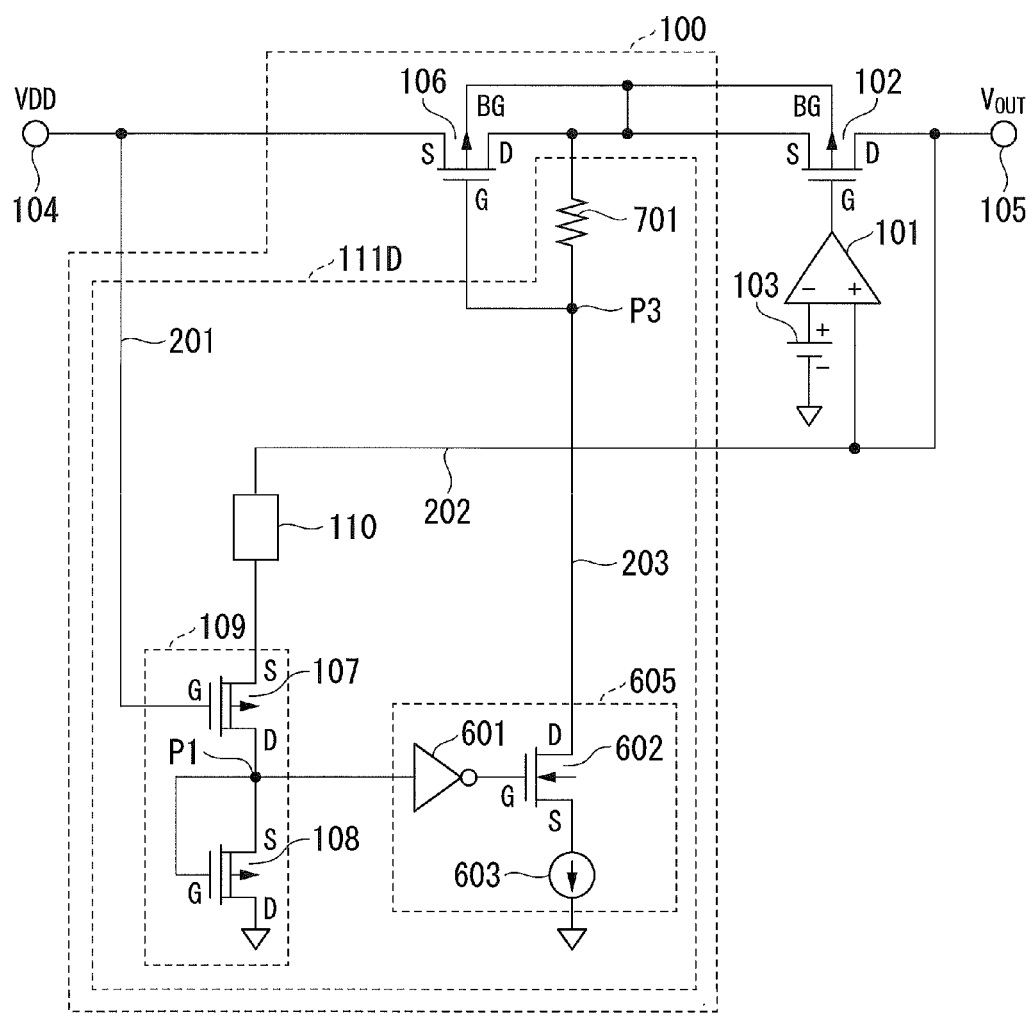
FIG. 5 is a schematic block diagram illustrating a power supply circuit using a reverse-current-prevention controller according to a fifth embodiment of the present invention.
Figure 6:
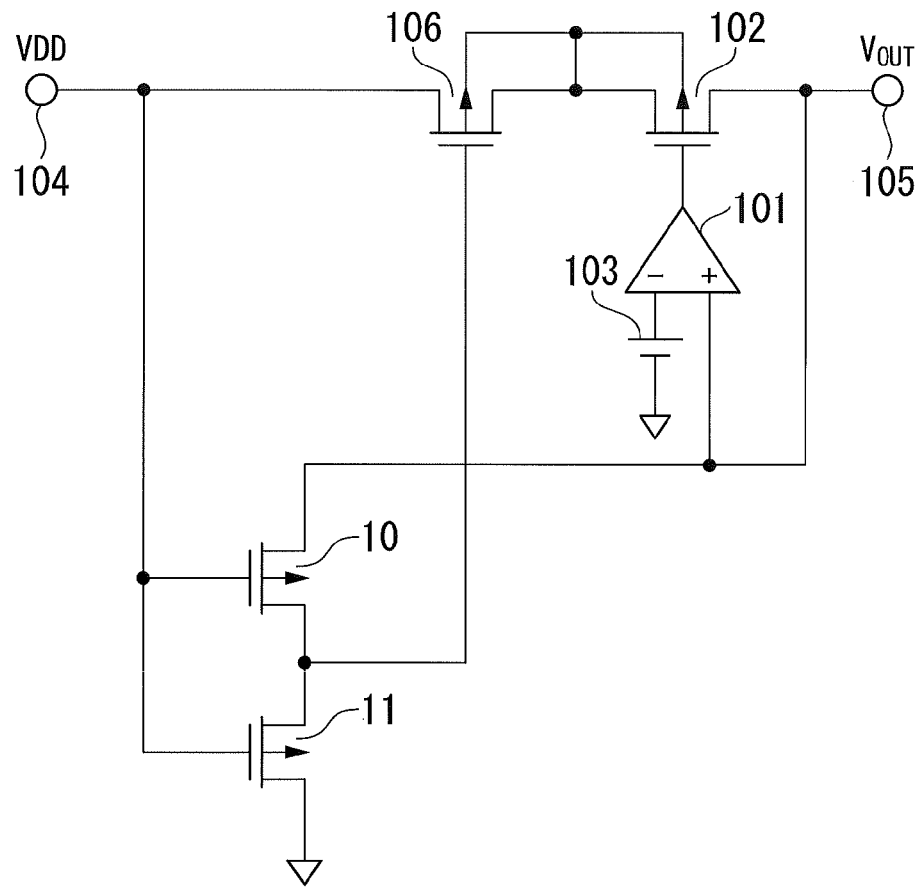
FIG. 6 is a schematic block diagram illustrating the configuration of a voltage regulator being a power supply circuit using a related art reverse-current-prevention circuit.

A fifth embodiment of the present invention will hereinafter be described with reference to the accompanying drawings. FIG. 5 is a schematic block diagram illustrating a power supply circuit using a reverse-current-prevention controller 111D according to the fifth embodiment of the present invention. The fifth embodiment is different from the second embodiment in that the reverse-current-prevention controller 111D is equipped with a current control circuit 605 and a resistor 701.

The current control circuit 605 is equipped with an inverter 601, a fourth transistor 602, and a constant current source 603.

The inverter 601 has an input terminal connected to a connecting point P1 of a constant current inverter 109, and an output terminal connected to a gate G of the fourth transistor 602.

The fourth transistor 602 is an N-channel MOS transistor and has a drain D connected to a gate G of a reverse-current-prevention transistor 106 through a connecting point P3, and a source S grounded through the constant current source 603.

The resistor 701 has one end connected to a drain D of the reverse-current-prevention transistor 106, and the other end connected to the drain D of the fourth transistor 602 through the connecting point P3. A resistance value of the resistor 701 is set in such a manner that when the fourth transistor 602 is brought into on state, the voltage of the connecting point P3 becomes sufficiently large by the constant current source 603 to bring the reverse-current-prevention transistor 106 into on state.

Since the connecting point P1 is at an "L" level and a signal level output from the inverter 601 is at an "H" level in a steady state where VDD+Vf110≥Vout holds, the fourth transistor 602 is supplied with the signal of the "H" level at its gate G and thereby turned into on state. Thus, since the voltage of the connecting point P3 is lowered, the reverse-current-prevention transistor 106 is brought into on state.

On the other hand, in an abnormal state in which reverse current flows and VDD+Vf110<Vout holds, since the voltage of the connecting point P1 increases and the signal level output from the inverter 601 becomes an "L" level, the fourth transistor 602 is brought into off state. Thus, since no current flows through the resistor 701, and the voltage of the connecting point P3 becomes equal to a voltage at the drain D of the reverse-current-prevention transistor 106, the reverse-current-prevention transistor 106 is brought into off state.

According to the present embodiment, there is an effect that the gate of the reverse-current-prevention transistor 106 is controlled by the output of an inverter having the resistor 701, the fourth transistor 602, and the constant current source 603 to adjust the resistance value of the resistor 701 and the current value of the constant current source 603, thereby making it possible to control a gate voltage at the time when the reverse-current-prevention transistor 106 is in on state and prevent deterioration of the gate G of the reverse-current-prevention transistor 106.

Further, the reverse-current-prevention controller 111 of the first embodiment may also have a configuration similar to that of the reverse-current-prevention controller 111D and may be constructed to insert the above-described current control circuit 605 between the connecting point P1 of the constant current inverter 109 in FIG. 1 and the gate G of the reverse-current-prevention transistor 106 and insert the resistor 701 between the gate G and drain D of the reverse-current-prevention transistor 106.

Furthermore, although each of the first through fifth embodiments has described by the use of the voltage-follower-type (tracker-type) voltage regulator 1 as an example, in which the output voltage Vout is controlled to be equal to the reference voltage Vref as the power supply circuit, the embodiment may also be used in a configuration for preventing a reverse current from an output stage transistor in an output stage of a power supply such as a step-down voltage regulator which controls a feedback voltage Vfb obtained by dividing an output voltage Vout by voltage division resistors to be equal to a reference voltage Vref.

Although the embodiments of the present invention have been described above in detail with reference to the accompanying drawings, specific configurations are not limited to the embodiments and also include design or the like in the scope not departing from the spirit of the present invention.

What is claimed is:

1. A reverse-current-prevention circuit comprising:
a reverse-current-prevention transistor being a P-channel MOS transistor inserted in series between an input terminal supplied with a power supply voltage and an output stage transistor being a P-channel MOS transistor suppling a prescribed output voltage from an output terminal; and
a reverse-current-prevention controller configured to bring the reverse-current-prevention transistor from an on state to an off state according to exceedance of the output voltage to the power supply voltage, and having:
a first transistor being a depletion type P-channel MOS transistor and having a source connected to the output terminal and a gate connected to the input terminal, and
a second transistor being a depletion type P-channel MOS transistor and having a source connected to a gate of the second transistor, a drain of the first transistor, and a gate of the reverse-current-prevention transistor, and a drain being grounded,
wherein the reverse-current-prevention controller controls on and off of the reverse-current-prevention transistor according to a voltage of the drain of the first transistor.

2. The reverse-current-prevention circuit according to claim 1, wherein the gates of the first transistor and the second transistor have an equal in aspect ratio, and
wherein the voltage of the drain of the first transistor rises to turn off the reverse-current-prevention transistor according to exceedance of the output voltage applied to the source of the first transistor to the power supply voltage applied to the gate of the first transistor.

3. The reverse-current-prevention circuit according to claim 2, further comprising a PN junction element inserted in a forward direction between the output terminal and the source of the first transistor.

4. The reverse-current-prevention circuit according to claim 2, further comprising a waveform shaping circuit inserted between the drain of the first transistor and the gate of the reverse-current-prevention transistor.

5. The reverse-current-prevention circuit according to claim 2, wherein a third transistor being a depletion type P-channel MOS transistor and a switch are inserted in parallel between the drain of the second transistor and the ground,
wherein the third transistor has a source connected to the drain of the second transistor, a gate connected to the gate of the second transistor, and drain being grounded, and
wherein on and off of the switch is controlled by the reverse-current-prevention controller along with the reverse-current-prevention transistor.

6. The reverse-current-prevention circuit according to claim 1, further comprising a PN junction element inserted in a forward direction between the output terminal and the source of the first transistor.

7. The reverse-current-prevention circuit according to claim 6, further comprising a waveform shaping circuit inserted between the drain of the first transistor and the gate of the reverse-current-prevention transistor.

8. The reverse-current-prevention circuit according to claim 6, wherein a third transistor being a depletion type P-channel MOS transistor and a switch are inserted in parallel between the drain of the second transistor and the ground, wherein the third transistor has a source connected to the drain of the second transistor, a gate connected to the gate of the second transistor, and drain being grounded, and wherein on and off of the switch is controlled by the reverse-current-prevention controller along with the reverse-current-prevention transistor.

9. The reverse-current-prevention circuit according to claim 1, further comprising a waveform shaping circuit inserted between the drain of the first transistor and the gate of the reverse-current-prevention transistor.

10. The reverse-current-prevention circuit according to claim 9, wherein a third transistor being a depletion type P-channel MOS transistor and a switch are inserted in parallel between the drain of the second transistor and the ground, wherein the third transistor has a source connected to the drain of the second transistor, a gate connected to the gate of the second transistor, and drain being grounded, and wherein on and off of the switch is controlled by the reverse-current-prevention controller along with the reverse-current-prevention transistor.

11. The reverse-current-prevention circuit according to claim 1, further comprising:

a resistor inserted between the drain and gate of the reverse-current-prevention transistor, and a current controller inserted between the gate of the reverse-current-prevention transistor and the drain of the first transistor and configured to control a current flow through the resistor by the voltage of the drain of the first transistor, wherein the current controller increases the current flow through the resistor according to exceedance of the output voltage to the power supply voltage.

12. The reverse-current-prevention circuit according to claim 11, wherein a third transistor being a depletion type P-channel MOS transistor and a switch are inserted in parallel between the drain of the second transistor and the ground, wherein the third transistor has a source connected to the drain of the second transistor, a gate connected to the gate of the second transistor, and drain being grounded, and wherein on and off of the switch is controlled by the reverse-current-prevention controller along with the reverse-current-prevention transistor.

13. The reverse-current-prevention circuit according to claim 1, wherein a third transistor being a depletion type P-channel MOS transistor and a switch are inserted in parallel between the drain of the second transistor and the ground, wherein the third transistor has a source connected to the drain of the second transistor, a gate connected to the gate of the second transistor, and drain being grounded, and wherein on and off of the switch is controlled by the reverse-current-prevention controller along with the reverse-current-prevention transistor.

14. A power supply circuit comprising:

an output stage transistor being a P-channel MOS transistor and having a source supplied with a power supply voltage from an input terminal and a drain from which a prescribed output voltage is provided to an output terminal in accordance with a gate voltage applied to a gate of the output stage transistor;

a reverse-current-prevention transistor being a P-channel MOS transistor and having a source connected to the input terminal and a drain connected to the source of the output stage transistor, and configured to prevent a reverse current coming from the output terminal through a parasitic diode on the source side of the output stage transistor; and a reverse-current-prevention controller configured to bring the reverse-current-prevention transistor from an on state to an off state according to exceedance of the output voltage to the power supply voltage, and having:

a first transistor being a depletion type P-channel MOS transistor and having a source connected to the output terminal and a gate connected to the input terminal, and a second transistor being a depletion type P-channel MOS transistor and having a source connected to a gate of the second transistor, a drain of the first transistor, and a gate of the reverse-current-prevention transistor, and a drain being grounded.

* * * * *